US007359163B2

United States Patent
Amano et al.

(10) Patent No.: US 7,359,163 B2
(45) Date of Patent: Apr. 15, 2008

(54) TUNNEL MAGNETORESISTANCE EFFECT DEVICE, AND A PORTABLE PERSONAL DEVICE

(75) Inventors: Minoru Amano, Kanagawa-ken (JP); Yoshiaki Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 280 days.

(21) Appl. No.: 10/884,946

(22) Filed: Jul. 7, 2004

(65) Prior Publication Data

US 2004/0240123 A1    Dec. 2, 2004

Related U.S. Application Data

(63) Continuation of application No. 09/944,404, filed on Sep. 4, 2001, now Pat. No. 6,801,414.

(30) Foreign Application Priority Data

Sep. 11, 2000 (JP) .............................. 2000-275030
Jul. 12, 2001 (JP) .............................. 2001-212595

(51) Int. Cl.
    *G11B 5/33* (2006.01)
(52) U.S. Cl. .................................. 360/324.2
(58) Field of Classification Search ............. 360/324.2, 360/324.11, 314, 97.01
    See application file for complete search history.

(56) References Cited

U.S. PATENT DOCUMENTS 5,949,622 A    9/1999    Kamiguchi et al.

(Continued)

FOREIGN PATENT DOCUMENTS

| JP | 2000-020922 | 1/2000 |
| JP | 2000-156530 | 6/2000 |
| JP | 2001-210894 | 8/2001 |
| JP | 2001-345493 | 12/2001 |
| KR | 2000-0022772 | 4/2000 |

OTHER PUBLICATIONS

Cardoso et al., Influence of Ta antidiffusion barriers on the thermal stability of tunnel junctions, Appl. Phys. Lett., vol. 76, No. 25, Jun. 19, 2000, pp. 3792-3794.
Sun et al, Low resistance and High Thermal Stability of Spin-Dependent Tunnel Junctions with Synthetic antiferromagnetic CoFe/Ru/CoFe Pinned Layers, Appl. Pys. Lett., vol. 76, No. 17, Apr. 24, 2000, pp. 2424-2426.

(Continued)

*Primary Examiner*—Tianjie Chen
(74) *Attorney, Agent, or Firm*—Oblon, Spivak, McClelland, Maier & Neustadt, P.C.

(57) ABSTRACT

A TMR device comprising an antiferromagnetic layer made of an antiferromagnetic material containing Mn, a magnetization fixed layer made of a ferromagnetic material, a tunnel barrier layer made of a dielectric material, and a magnetization free layer made of a ferromagnetic material. An insulator material layer is inserted in the magnetization fixed layer at a distance from the antiferromagnetic material layer and the tunnel barrier layer. One material can be expressed by NX, where X is a first element selected from the group consisting of oxygen, nitrogen and carbon; and N is a second element, provided that the bonding energy between the first and the second elements is higher than the bonding energy between manganese and the first element. A second material can be expressed by MX, where M is an element selected from the group consisting of titanium, tantalum, vanadium, aluminum, europium, and scandium; and X is an element selected from the group consisting of oxygen, nitrogen and carbon. The tunnel magnetoresistance effect device suppresses the diffusion of Mn from the Mn based alloy constituting the antiferromagnetic material layer even after heat treatment is performed.

27 Claims, 7 Drawing Sheets

U.S. PATENT DOCUMENTS

| | | |
|---|---|---|
| 6,023,395 A | 2/2000 | Dill et al. |
| 6,110,751 A | 8/2000 | Sato et al. |
| 6,219,212 B1 | 4/2001 | Gill et al. |
| 6,275,363 B1 * | 8/2001 | Gill .................. 360/324.2 |
| 6,303,218 B1 | 10/2001 | Kamiguchi et al. |
| 6,353,519 B2 * | 3/2002 | Pinarbasi ............ 360/324.11 |
| 6,356,419 B1 * | 3/2002 | Gill .................. 360/324.11 |
| 6,369,993 B1 | 4/2002 | Hayashi |
| 6,473,275 B1 * | 10/2002 | Gill .................... 360/314 |
| 6,483,675 B1 | 11/2002 | Araki et al. |
| 6,495,275 B2 | 12/2002 | Kamiguchi et al. |
| 6,544,801 B1 | 4/2003 | Slaughter et al. |
| 6,549,383 B1 * | 4/2003 | Gill .................. 360/324.11 |
| 6,556,390 B1 | 4/2003 | Mao et al. |
| 6,567,246 B1 | 5/2003 | Sakakima et al. |
| 6,608,738 B2 | 8/2003 | Sakakima et al. |
| 6,816,337 B1 * | 11/2004 | Mukaijima et al. ...... 360/97.01 |
| 2004/0240123 A1 | 12/2004 | Amano et al. |

OTHER PUBLICATIONS

Zhang et al., AD-13, 40% TMR after Anneal at 350° C. for Tunnel Junctions with Iron Oxide Interface Layers, Proc of 8$^{th}$ Joint MMM—Inter Mag Conf. AD-13, Jan. 7, 2001.

Moodera et al, Ferromagnetic-Insulator-Ferromagnetic Tunneling: Spin-dependent Tunneling and Large Magnetoresistance in Trilayer Junctions (invited) J. Appl. Phys. vol. 79 (8), Apr. 15, 1996, pp. 4724-4729.

\* cited by examiner

TUNNEL MAGNETORESISTANCE EFFECT DEVICE, AND A PORTABLE PERSONAL DEVICE

CROSS-REFERENCE TO RELATED APPLICATIONS

This application claims the benefit of priority from the prior Japanese Patent Application No. 2000-275030, filed on Sep. 11, 2000; the entire contents of which are incorporated herein by reference.

BACKGROUND OF THE INVENTION

1. Field of the Inventions

The present invention relates to a tunnel magnetoresistance effect device and to a portable personal device having a magnetic memory provided with said tunnel magnetoresistance effect device.

2. Discussion of the Background

A magnetoresistance effect element using a ferromagnetic thin film is used in, for instance, a magnetic head, a magnetic sensor, etc. Furthermore, a magnetic random access memory (MRAM) is recently proposed, which comprises a semiconductor substrate having formed thereon a magnetoresistance effect device. The MRAM is attracting attention as a next generation memory device promising high speed operation, high capacity, and non-volatile features.

In the magnetoresistance effect, the electric resistance of the ferromagnet itself changes with its direction of magnetization. Thus, a ferromagnet functions as a memory device because it can record information in accordance with the direction of its magnetization, and the information thus recorded can be read in accordance with the size of the electric resistance.

Recently, in a ferromagnetic tunnel junction having a sandwich structure comprising two ferromagnetic layers with a dielectric material inserted between them as a tunnel barrier layer, a magnetoresistivity ratio of 20% or higher is obtained by the tunnel magnetoresistance effect (TMR effect) (J. Appl. Phys., 79 (1996), p. 4724). A device having a ferromagnetic tunnel junction is denoted as a tunnel magnetoresistance effect device (TMR device).

In a TMR device, the direction of magnetization of one of the two ferromagnetic material layers sandwiching the tunnel barrier layer of dielectric material, i.e., the magnetization fixed layer, is fixed, and by changing the direction of magnetization of the other ferromagnetic layer that is in a magnetically non-coupled state with the magnetization fixed layer, i.e., the magnetization free layer in accordance with the applied external magnetic field, information of either "0" or "1" is recorded thereto. A TMR device having such a structure is called a "spin-valve TMR device".

To fix the direction of magnetization in the magnetization fixed layer, an antiferromagnetic material layer made of an antiferromagnetic material is provided in contact with the ferromagnetic layer to utilize the exchange coupling between the antiferromagnetic layer and the magnetization fixed layer.

FIG. 1 shows a cross sectional structure of a spin valve TMR device using an antiferromagnetic layer.

Referring to FIG. 1, the structure comprises an antiferromagnetic material layer 101 made of an antiferromagnetic material, having sequentially laminated thereon a magnetization fixed layer 102 made of a ferromagnetic material, a tunnel barrier layer 103 made of a dielectric material, and a magnetization free layer 104 made of a ferromagnetic material.

The magnetization of the magnetization fixed layer 102 is fixed in the direction indicated by an arrow A shown in FIG. 1 by the exchange coupling of the antiferromagnetic material layer 101. In contrast to this, the magnetization of the magnetization free layer 103 changes in accordance with an external magnetization field within a range indicated by arrows B and C shown in FIG. 1. As a result, the electric resistance of the TMR device yields a maximum when the direction of magnetization B of the magnetization free layer 104 is reversely parallel with the direction of magnetization A of the magnetization fixed layer 102, and yields a minimum when the direction of magnetization C of the magnetization free layer 104 is in parallel with the direction A.

A sense current for detecting the electric resistance of the TMR device is applied by a pair of electrodes connected to the upper and the lower planes (i.e., the upper plane of the magnetization free layer 104 and the lower plane of the antiferromagnetic material layer 101 shown in FIG. 1) of the TMR device. The direction of the sense current is perpendicular to the film plane of each of the layers.

The ferromagnetic material used in the magnetization free layer 104 and the magnetization fixed layer 102 is an alloy containing a magnetic metal selected from the group consisting of Co, Fe, and Ni. On the other hand, for the antiferromagnetic material that is used for the antiferromagnetic material layer 101, generally employed is an alloy containing Mn, such as IrMn, PtMn, RuRhMn, etc.

A process for producing a MRAM and the like by employing the TMR device above comprises a heat treatment in a temperature range of from about 300 to about 450° C., such as a film deposition of an interlayer dielectric onto the SV-TMR device by means of CVD, a metal reflow treatment, etc. By applying such a heat treatment, Mn included in the antiferromagnetic material layer 101 of the TMR device easily diffuses into the magnetization fixed layer 102 and reaches the vicinity of the tunnel barrier layer 103. The diffused Mn then lowers the spin polarization ratio of the magnetization fixed ratio 102 and leads to a problematic decrease in magnetoresistivity ratio of the TMR device.

In order to prevent the lowering of the magnetoresistivity ratio from occurring, it has been suggested to insert a metallic layer made of a refractory metal, such as Ta, Ru, etc., into the magnetization fixed layer 102 (Appl. Phys. Lett., 76 (2000) 3792; and Appl. Phys. Lett., 76 (2000) 2424). However, as a result of the studies of the present inventors, it has been found that the metallic elements above cause grain boundary diffusion of Mn at temperatures of 300° C. or higher, and that it is not possible to prevent the diffusion of Mn from occurring into the tunnel barrier layer.

Furthermore, it has also been suggested to insert a layer of a refractory metal into the interface between the antiferromagnetic material layer 101 and the magnetization fixed layer 102 (Appl. Phys. Lett., 76 (2000) 3792). However, as a result of the studies of the present inventors, it has been found that a refractory metal layer provided at the interface between the antiferromagnetic material layer 101 and the magnetization fixed layer 102 not only greatly impairs the fixing of the magnetization of the fixed layer 102, but also raises a concern that the refractory metal itself undergoes diffusion.

SUMMARY OF THE INVENTION

An object of the present invention is to provide a tunnel magnetoresistance effect device (TMR device) that is capable of effectively suppressing the diffusion of Mn from the antiferromagnetic material layer made of a Mn-based alloy into the tunnel barrier layer even in case of heat treatment, and yet, which exhibits superior device characteristics and thermal stability. Another object of the present invention is to provide a portable personal device equipped with such a TMR device.

In a first aspect, the present invention provides a tunnel magnetoresistance effect device comprising a first antiferromagnetic material layer containing manganese, a first magnetization fixed layer of ferromagnetic material disposed on the first antiferromagnetic material layer, a first inserted layer of an insulator material disposed on the first magnetization fixed layer, a second magnetization fixed layer of ferromagnetic material disposed on the first inserted layer, a first tunnel barrier layer of dielectric material disposed on the second magnetization fixed layer, and a magnetization free layer of ferromagnetic material disposed on the first tunnel barrier layer.

In a second aspect, a tunnel magnetoresistance effect device, comprises a first antiferromagnetic material layer containing manganese, a first magnetization fixed layer of ferromagnetic material disposed on the first antiferromagnetic material layer, a first inserted layer disposed on the first magnetization fixed layer and comprising MX, where M is an element selected from the group consisting of manganese, titanium, tantalum, vanadium, aluminum, europium, and scandium, and X is an element selected from the group consisting of oxygen, nitrogen, and carbon, a second magnetization fixed layer of ferromagnetic material on the first inserted layer, a first tunnel barrier layer of dielectric material on the second magnetization fixed layer, and a magnetization free layer of ferromagnetic material disposed on the first tunnel barrier layer.

In a third aspect, a tunnel magnetoresistance effect device comprises a first antiferromagnetic material layer containing manganese, a first magnetization fixed layer of ferromagnetic material on the first antiferromagnetic material layer, a first inserted layer on the first magnetization fixed layer and comprising NX, where N is a first element, X is a second element selected from the group consisting of oxygen, nitrogen, and carbon, and the bonding energy between the first and second elements is higher than the bonding energy between manganese and the second element, a second magnetization fixed layer of ferromagnetic material disposed on the first inserted layer, a first tunnel barrier layer of dielectric material on the second magnetization fixed layer, and a magnetization free layer of ferromagnetic material on the first tunnel barrier layer.

In a fourth aspect, a tunnel magnetoresistance effect device comprises a first antiferromagnetic material layer containing manganese, a first magnetization fixed layer of a first ferromagnetic material on the first antiferromagnetic material layer, a first inserted layer on the first magnetization fixed layer and comprising $L_1X$, where $L_1$ is a ferromagnetic element of the first ferromagnetic material or a ferromagnetic element of a second ferromagnetic material, and X is an element selected from the group consisting of oxygen, nitrogen, and carbon, a second magnetization fixed layer of the second ferromagnetic material disposed on the first inserted layer, a first tunnel barrier layer of ferromagnetic material on the second magnetization fixed layer, and a magnetization free layer of ferromagnetic material on the first tunnel barrier layer.

In a fifth aspect, a tunnel magnetoresistance effect deice comprises a first antiferromagnetic material layer containing manganese, a first magnetization fixed layer of ferromagnetic material and on the first antiferromagnetic material layer, a first inserted layer of an amorphous magnetic material on the first magnetization fixed layer, a second magnetization fixed layer of ferromagnetic material on the first inserted layer, a first tunnel barrier layer of dielectric material on the second magnetization fixed layer, and a magnetization free layer of ferromagnetic material on the first tunnel barrier layer.

Each of the magnetization fixed layers may have respective fixed magnetization that doesn't substantially rotate in an applied magnetic field in which magnetization of the magnetization free layer does rotate.

In accordance with the invention as above, the diffusion of Mn from the antiferromagnetic material layer made of a Mn-based alloy into the tunnel barrier layer, even in case of heat treatment, can be effectively suppressed, and hence, a TMR device having superior device characteristics and thermal stability can be provided.

The TMR device above provides a magnetic memory device such as a MRAM when formed integrated on a semiconductor substrate and the like. The magnetic memory device can substitute conventional DRAMs, SRAMs, etc. Thus, a memory device obtained by integrating the TMR device according to the present invention can be mounted on a portable personal communication device such as a personal digital assistant, a portable personal computer, and a portable personal telephone (cellular phone), etc.

Furthermore, the TMR device according to the present invention can be applied to a magnetic sensor for reading out the magnetic information or a magnetic reproduction head (a magnetoresistance effect head). A magnetic reproduction head having mounted thereon the TMR device according to the present invention is also applicable to a magnetic reproduction device such as a hard disk drive.

BRIEF DESCRIPTION OF THE DRAWINGS

A more complete appreciation of the invention and many of the attendant advantages thereof is readily obtained as the state becomes better understood by reference to the following detailed description when considered in connection with the accompanying drawings.

DETAILED DESCRIPTION OF THE PREFERRED EMBODIMENTS

In various aspects, the present invention relates to a magnetic tunnel device showing a magnetoresistance effect having high magnetoresistance effect amplitude.

First Embodiment of the Present Invention

Figure 1:
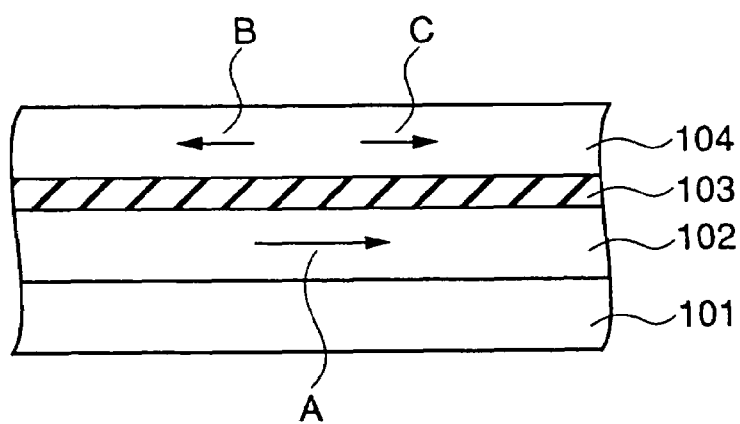
FIG. 1 is a cross section view of a TMR device of a conventional type.
Figure 2:
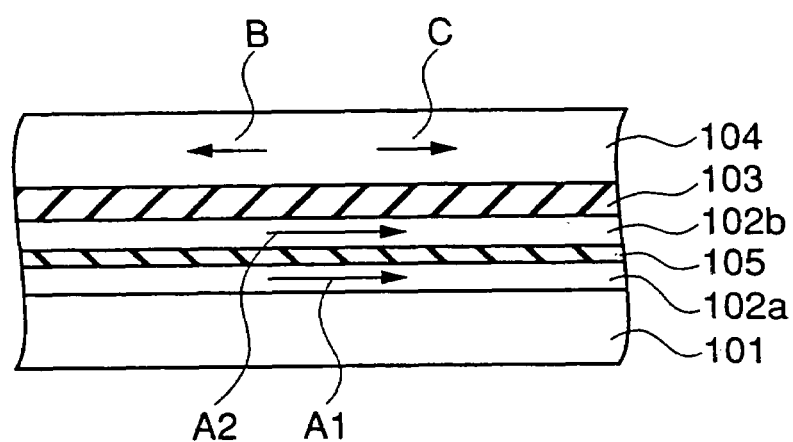
FIG. 2 is a cross section view of a TMR device according to a first embodiment of the present invention.

FIG. 2 shows a cross section view of a TMR device according to a first embodiment of the present invention.

Referring to FIG. 2, the TMR device according to the first embodiment comprises an antiferromagnetic material layer 101 made of an antiferromagnetic material, a first magnetization fixed layer 102a made of a ferromagnetic material, an insulator material layer 105, a second magnetization fixed layer 102b made of a ferromagnetic material, a tunnel barrier layer 103 made of an insulator material, and a magnetization free layer 104 made of a ferromagnetic material.

Each of the layers above is laminated sequentially on a substrate not shown. Furthermore, the order of laminating the layers on a substrate as shown in the structure of FIG. 2 may be reversed. Additionally, the preposition "on" used in this specification and the appended claims does not exclude intervening layers unless "direct contact" is specified.

For the antiferromagnetic material for use in the antiferromagnetic material layer 101, there can be used, for instance, IrMn, PtMn, RuRhMn, or other alloys containing Mn. For the first and the second magnetization fixed layers 102a and 102b, there can be used, for instance, a magnetic material selected from the group consisting of Co, Fe, and Ni, or an alloy containing a magnetic metal. For the dielectric material for use in the tunnel barrier layer 103, there can be used a non-magnetic dielectric material such as $Al_2O_3$, $SiO_2$, etc. Concerning the average thickness of the antiferromagnetic material layer 101, the first and the second magnetization fixed layers 102a, 102b, and the tunnel barrier layer 103, explanation can be found in the description for the second, the third, and the fifth embodiments of the present invention.

The first magnetization fixed layer 102a is disposed on the antiferromagnetic material layer 101, and is provided with its magnetization fixed in the direction indicated by an arrow A1 shown in FIG. 2 in accordance with the exchange coupling with the antiferromagnetic material layer 101. The second magnetization fixed layer 102b is provided with its magnetization fixed in a direction A2 that is in parallel with the direction shown by the arrow A1 by the magnetic coupling with the first magnetization fixed layer 102a. The fixed layers above maintain a substantially fixed magnetization even when exposed to zero magnetic field or to an external magnetic field in which the magnetization of the magnetization free layer functions.

On the other hand, the magnetization free layer 104 is arranged to have a lower coercive force than the second magnetization fixed layer 102b by choosing a suitable material, thickness, or structure. Therefore the magnetization of the magnetization free layer 104 changes between the directions indicated by arrows B and C shown in FIG. 2 in accordance with an external magnetic field. The electric resistance of the TMR device changes according to the change in relative angle between the magnetizations of the second magnetization fixed layer 102b and the magnetization free layer 104.

More specifically, if the direction of magnetization of the magnetization free layer 104 is in a direction indicated by the arrow C provided parallel to the direction of magnetization A1 and A2 of the first and the second magnetization fixed layers 102a and 102b, the resistance of the TMR device becomes low, and if the direction of magnetization of the magnetization free layer 104 is in the direction reversely parallel, i.e., in the direction indicated by the arrow B, the TMR device yields a high resistance.

In addition to the layers above, as shown in FIG. 2, the TMR device according to the embodiment of the present invention is provided with an insulator material layer 105 inserted between the first magnetization fixed layer 102a and the second magnetization fixed layer 102b.

The insulator material layer 105 is different from a conventional metallic layer and suppresses the diffusion of Mn from occurring at the grain boundary of the metallic layer. Accordingly, the TMR device comprising the insulator material layer 105 exhibits stable characteristics even in case it undergoes a heat treatment at a temperature exceeding about 300° C. during its production process. Furthermore, since the diffusion of Mn can be sufficiently suppressed even if the insulator material layer 105 should be provided at an average thickness of about 1 nm or less, it does not impair the fixing of magnetization of the magnetization fixed layers 102a and 102b.

In accordance with the present embodiment, usable as the insulator material for the insulator material layer 105 are oxides, nitrides, or carbides expressed by a general formula MX, where, M represents an element selected from the group consisting of (1) Mn or an element which forms a bond more easily than Mn with oxygen, nitrogen, or carbon, and (2) a group of ferromagnetic elements contained in the first or the second magnetization fixed layer; and X represents an element selected from the group consisting of oxygen, nitrogen, and carbon. The reason for using the dielectric materials above for the insulator material layer 15 is as follows. The explanation herein is made to a specific case by taking an oxide as an example.

If an oxide of Mn or an element less apt to be oxidized than Mn (i.e., an element less apt to form a bond with oxygen) is used for the insulator material layer 105, the element undergoes reduction by Mn diffused from the antiferromagnetic material layer 101 during the heat treatment, and the element resulting from the reduction diffuses into the second magnetization fixed layer 102b. If the element thus diffused reaches the vicinity of the tunnel barrier layer 103, the magnetoresistivity ratio may yield a value different from the desired value. In case a non-magnetic material undergoes diffusion, it may diffuse and reach the vicinity of the tunnel barrier layer 103 to lower the spin polarization ratio of the second magnetization fixed layer 102b and thus deteriorate the characteristics.

If an oxide of Mn or of an element (1) more apt to be oxidized than Mn should be used for the insulator material layer 105, the element (1) is not reduced by the diffused Mn, and hence provides a stable insulator material layer 105. As elements more apt to be oxidized, usable are Ti, Ta, V, Al, Eu, or Sc. Furthermore, there can be used an oxide of a ferromagnetic element (at least one element selected from the group consisting of Fe, Co, and Ni) for the insulator material layer 105.

Furthermore, by using an oxide of a ferromagnetic element (2) contained in the first or the second magnetization fixed layers 102a and 102b as the insulator material layer 105, no deterioration of characteristics such as a drop in spin polarization ratio of the magnetization fixed layer should occur because only the ferromagnetic elements undergo reduction. Furthermore, by using an element (2), there is no need of preparing an additional material, and hence it makes it possible to provide a TMR device at a lower cost.

Accordingly, as the oxide for use in the insulator material layer 105, mentioned is an oxide of an element selected from those belonging to (1) above, i.e., at least one element selected from the group consisting of Mn, Ti, Ta, V, Al, and Eu, or to (2) above, i.e., at least one element selected from the group consisting of Fe, Co, and Ni. The same applies to element M of a nitride or a carbide.

Referring to FIG. 2, the insulator material layer 105 is inserted between the lower magnetization fixed layer 102a and the upper magnetization fixed layer 102b in such a manner that it may be separated from the antiferromagnetic material layer 101 and the tunnel barrier layer 103.

More specifically, if the insulator material layer 105 should be inserted at the boundary between the antiferromagnetic material layer 101 and the first magnetization fixed layer 102a, the fixing of magnetization of the first magnetization fixed layer 102a becomes insufficient. On the other hand, if the insulator material layer 105 should be inserted at the boundary between the tunnel barrier layer 103 and the second magnetization fixed layer 102b, the spin tunneling characteristics desired.

The thickness of the insulator material layer 105 can be adjusted in such a manner that it should not impair fixing of magnetization between the first and the second magnetization fixed layers 102a and 102b, and that the tunnel resistance of the insulator material layer 105 may become sufficiently smaller than that of the ferromagnetic tunnel junction. The average thickness of the insulator material layer 105 can be set to about 2 nm or less, and preferably, it is set to about 1 nm or less.

On the other hand, if the insulator material layer should be too thin, difficulty is found in preparing a continuous film, and there may be cases making it impossible to achieve the function of preventing the diffusion of Mn from occurring. Thus, the average thickness of the insulator layer can be set to about 0.2 nm or more, and preferably, to about 0.5 nm or more.

A process can fabricate the TMR device according to the present embodiment as follows.

More specifically, in a method for fabricating a TMR device comprising a tunnel junction comprising, as the constituent elements, an antiferromagnetic material layer made of an antiferromagnetic material containing Mn, a magnetization fixed layer made of a ferromagnetic material, a tunnel barrier layer made of a dielectric material, and a magnetization free layer made of a ferromagnetic material, the fabrication method comprises forming a ferromagnetic thin film constituting a part of said magnetization fixed layer, forming a dielectric material layer on said ferromagnetic thin film, and forming a ferromagnetic thin film constituting the other portions of said magnetization fixed layer on the dielectric material layer.

Furthermore, in case of forming the dielectric material layer, a thin film of Mn or an element, which more easily bonds with oxygen, nitrogen, or carbon than Mn may be formed. The thin film may be exposed thereafter to an oxidizing, a nitriding, or a carbonizing atmosphere to form a dielectric thin film on the surface thereof.

Further preferably, at a portion separated from both the antiferromagnetic layer of the magnetization fixed layer and the tunnel barrier layer, there may be formed a layer of an oxide, a nitride, or a carbide of the ferromagnetic material constituting the magnetization fixed layer. After further forming an antiferromagnetic layer made of an antiferromagnetic material containing the Mn, heat treatment at a temperature not lower than about 200° C. or not lower than 250° C. may be performed, such that a part of the Mn constituting the antiferromagnetic layer may diffuse into said magnetization fixed layer and form bonding with oxygen, nitrogen, or carbon contained in the layer made of oxide, nitride, or carbide.

Second Embodiment of the Present Invention

Figure 3A:
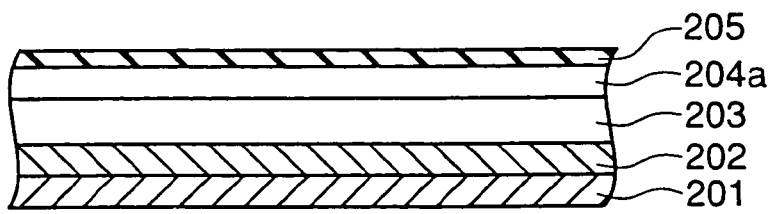
FIGS. 3A, 3B, and 3C are cross section diagrams provided as an explanatory means for a TMR device and a method for producing the same according to a second embodiment of the present invention.
Figure 3B:
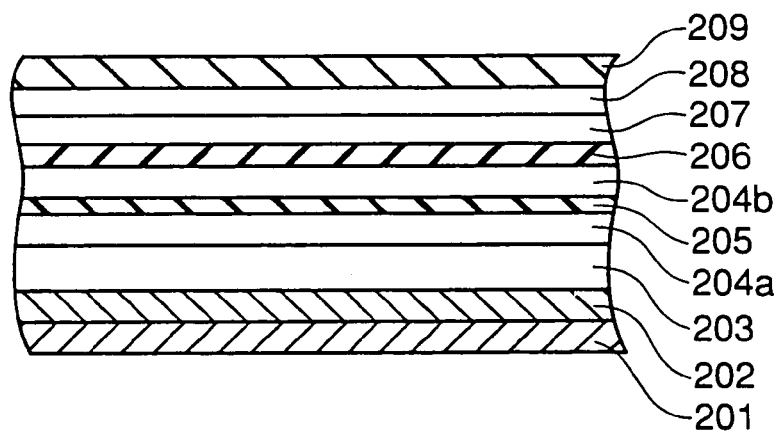
Figure 3C:
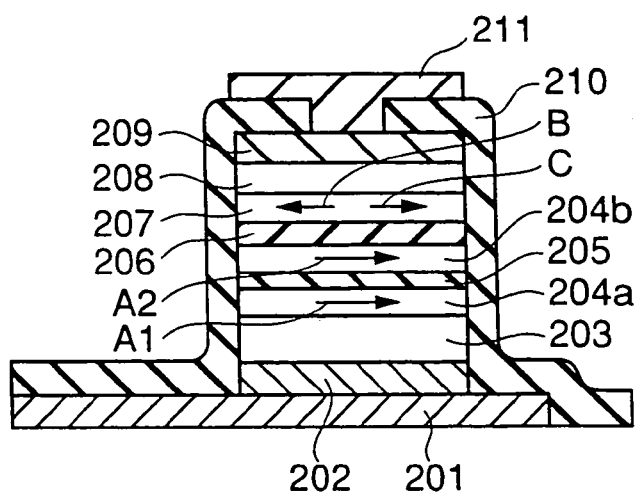

FIGS. 3A, 3B, and 3C are each a cross section view provided as explanatory means for describing the TMR device and the fabrication process thereof according to a second embodiment of the present invention.

Referring to FIG. 3C, the TMR device according to a second embodiment of the present invention comprises a buffer layer 202 made of Ta or the like comprising disposed thereon an antiferromagnetic layer 203 made of an antiferromagnetic material, a first and a second magnetization fixed layer 204a and 204b, an insulator material layer 205 made of an insulator material, a tunnel barrier layer 206 made of a non-magnetic dielectric material, a magnetization free layer 207, a soft magnetic layer 208 made of NiFe, etc., which causes the soft magnetization of the magnetization free layer 207, and a protective layer 209 made of Ta, etc.

A lower interconnection electrode layer 201 is formed below the antiferromagnetic material layer 203 with a buffer layer 202 interposed between them, and an upper interconnection electrode layer 211 is formed on the magnetization free layer 207 via a NiFe layer 208 and a protective layer 209. Through the upper and the lower interconnection electrodes 201 and 211, a sense current for detecting the electric resistance of the TMR device is applied in the direction vertical to the film planes of each of the layers.

Each of the first and the second magnetization fixed layers 204a and 204b is provided with fixed magnetization indicated by arrows A1 and A2 in FIG. 3C, and the magnetization of the magnetization free layer 207 changes within the range of directions shown by arrows B and C in FIG. 3C in accordance with an external magnetic field. Then, the change in electric resistance of the TMR device in accordance with the change in the direction of magnetization of the magnetization free layer 207 is detected by the sense current.

The process for fabricating the TMR device is described below.

Referring to FIG. 3A, firstly, a lower interconnection electrode layer 201 made of W, a buffer layer 202 made of Ta, an antiferromagnetic layer 203 made of PtMn, and a first magnetization fixed layer 204a made of CoFe and having an average thickness of about 2 nm are sequentially deposited on a substrate of a semiconductor or the like (not shown) by means of high vacuum sputtering.

Then, after forming a Ta thin film about 0.4 nm in average thickness on the first magnetization fixed layer 204a, the surface thereof is exposed to an atmosphere of oxygen plasma for about 20 seconds to oxidize Ta to form a Ta oxide layer 205 as shown in FIG. 3A.

Then, referring to FIG. 3B, a second magnetization fixed layer 204b made of CoFe with an average thickness of about 2 nm is deposited on the first magnetization fixed layer 204a, and after forming thereon a tunnel barrier layer 206 made of $Al_2O_3$, the surface of the tunnel barrier layer is plasma oxidized. Then, as shown in FIG. 3B, a magnetization free layer 207 made of Co$_7$Fe$_3$, a NiFe layer 208, and a protective layer 209 made of W are sequentially deposited on the tunnel barrier layer 206.

Subsequently, a photoresist pattern, which defines the shape of the lower interconnection electrode (not shown), is formed on the protective layer 209. By using the photoresist pattern as a mask, the portion of the region not covered by the mask, which ranges from the protective layer 209 to the lower interconnection electrode 201, is subjected to ion milling to form the pattern of the lower interconnection electrode layer 201 as shown in FIG. 3C.

Then, a photoresist pattern (not shown) defining the shape of the tunnel junction is formed, and by using this as a mask, the portion of the region not covered by the mask, which ranges from the protective layer 209 to the buffer layer 202, is subjected to ion milling to form the pattern of the tunnel junction as shown in FIG. 3C.

Then, after removing the photoresist pattern, a SiO$_2$ interlayer dielectric film 210 is deposited by means of reactive sputtering as shown in FIG. 3C. Then, by performing annealing for a duration of about 2 hours while applying a magnetic field of about 7 kOe in vacuum and at about 300° C., an antiferromagnetic coupling is imparted to the antiferromagnetic material layer 203 and the first magnetization fixed layer 204a. Simultaneously, magnetic coupling is imparted to the first and second magnetization fixed layers 204a and 204b to fix the magnetization A1 and A2 of the first and second magnetization fixed layers 204a and 204b.

Subsequently, after opening a contact hole in the interlayer dielectric film 210, an upper interconnection electrode 211 connected to the protective layer 200 is formed via the contact hole as shown in FIG. 3C. Thus is completed the fabrication of a SV-TMR device.

On annealing the SV-TMR device while applying a magnetic field of about 5 kOe in vacuum and at a temperature range of about 300° C. or higher but not higher than about 400° C., the magnetoresistivity ratio was found to maintain a value of about 45%.

On the other hand, in case of a SV-TMR device having a structure similar to that shown in FIG. 3C except for using Ta (not oxidized) as the insulator material layer 205, the magnetoresistivity ratio thereof was found to be reduced by applying an annealing similar to that above; i.e., the value was lowered to about 20% at a temperature of ca. 350° C., and to about 5% by annealing at ca. 400° C.

As described above, it has been found that the thermal stability of a TMR device can be improved by using a Ta oxide for the insulator material layer 205.

In the present embodiment, the Ta oxide layer 205 was formed by depositing a thin film of Ta, and by then oxidizing it with plasma. However, instead of employing the process above, the insulator material layer 205 may be formed by depositing a thin film by means of reactive sputtering of an oxide such as Ta oxide, etc., or a nitride or a carbide expressed by MX.

Otherwise, in case of using nitride or carbide other than the oxide as the insulator material layer 205, a thin film of Mn or an element which more easily forms a bond with nitrogen or carbon (i.e., an element M (1) as described above) may be formed after forming the first magnetization fixed layer 204a, and the resulting thin film may be then exposed to a nitriding atmosphere (e.g., nitrogen plasma or the like) or to a carbonizing atmosphere to thereby obtain an insulator material layer 205 made of a nitride or a carbide.

In the fabrication process according to the present embodiment, heat treatment may be performed after forming the antiferromagnetic material layer 203, a first magnetization fixed layer 204a, an insulator material layer 205 made of an oxide, a nitride or a carbide of the ferromagnetic material constituting the magnetization fixed layer, and a second upper magnetization fixed layer 204b. In this manner, a part of the Mn constituting the antiferromagnetic material layer 203 is allowed to diffuse inside the first magnetization fixed layer 204a and bond with oxygen, nitrogen, or carbon incorporated in the insulator material layer 205.

Since a ferromagnetic material included in the insulator material layer 205 generated by the heat treatment, the drop in spin polarization ratio can be prevented from occurring in the magnetization fixed layer. The temperature of the heat treatment can be set to about 200° C. or higher, at which the diffusion of Mn occurs. To shorten the heat treatment time, the temperature can be set to about 250° C. or higher, and furthermore, it can be set to about 300° C. or higher.

As a result, oxygen atoms, nitrogen atoms, or carbon atoms in a state not bonded with other elements, or in an insufficiently bonded state, may be present in the vicinity of the insulator material layer 205 or in the vicinity thereof.

Third Embodiment of the Present Invention

FIGS. 4A, 4B, 4C, and 4D are each a cross section view provided as explanatory means for describing the TMR device and the fabrication process thereof according to a third embodiment of the present invention.

Figure 4A:
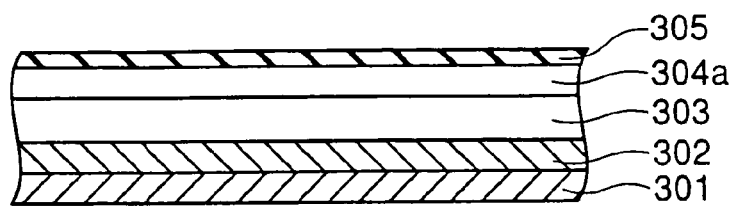
FIGS. 4A, 4B, 4C, and 4D are a cross section diagrams provided as an explanatory means for a TMR device and a method for producing the same according to a third embodiment of the present invention.
Figure 4B:
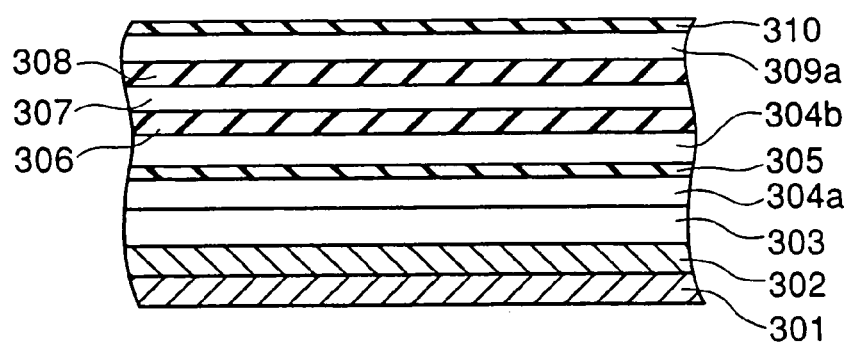
Figure 4C:
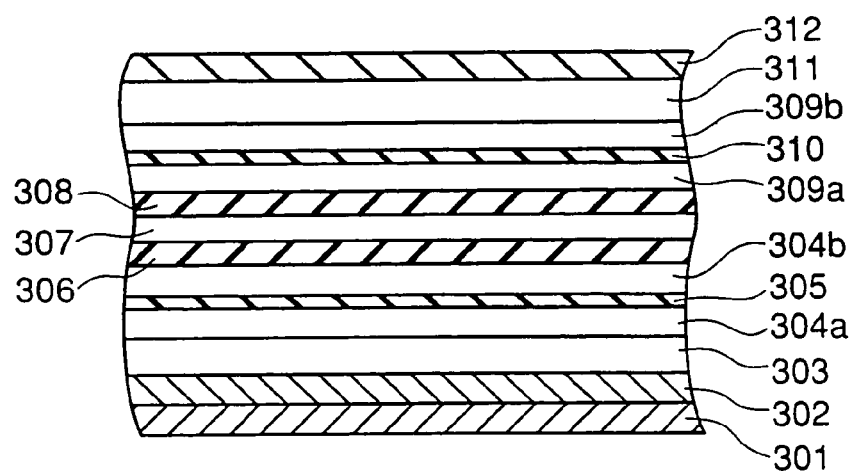
Figure 4D:
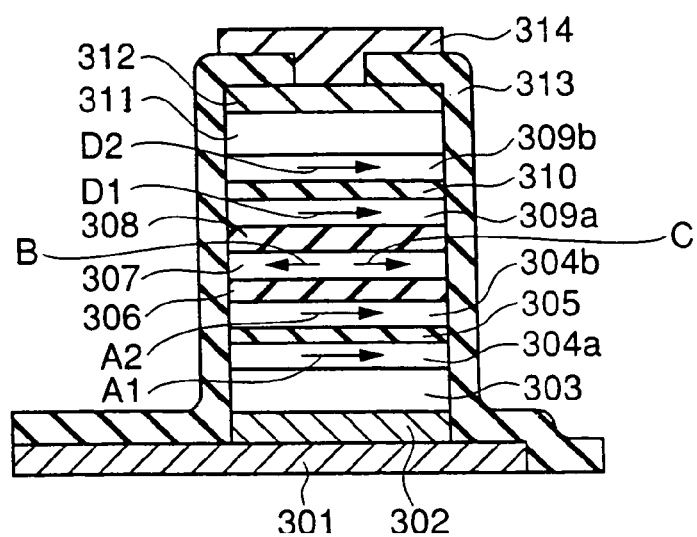

Referring to FIG. 4D, the TMR device is a dual spin valve TMR device having a double tunnel junction, comprising two magnetization fixed films on the upper and the lower sides of a magnetization free layer 307 via a first and a second tunnel barrier layer 306 and 308 disposed on the upper and the lower sides thereof.

The lower magnetization fixed film is provided with a first magnetization fixed layer 304a, a first insulator material layer 305, and a second magnetization fixed layer 304b, and the upper magnetization fixed film is provided with a third magnetization fixed layer 309a, a second insulator material layer 310, and a fourth magnetization fixed layer 309b.

The magnetization of the first magnetization fixed layer 304a is fixed by the exchange coupling with the antiferromagnetic material layer 303 in a direction A1 shown in FIG. 4D, and the magnetization of the second magnetization fixed layer 304b is fixed in a direction A2 shown in FIG. 4D by magnetic coupling with the first magnetization fixed layer 304a whose magnetization is fixed.

The magnetization of the fourth magnetization fixed layer 309b is fixed in the direction D2 shown in FIG. 4D by the exchange coupling with the antiferromagnetic material layer 311. Furthermore, the magnetization of the third magnetization fixed layer 309a is fixed in the direction D1 shown in FIG. 4D by magnetic coupling with the fourth magnetization fixed layer 309b. The magnetization of the first to the fourth magnetization fixed layers substantially maintains the direction of magnetization even when exposed to an external magnetic field or to a zero magnetic field.

The magnetization of the magnetization free layer 307 changes within the direction B and the direction C shown in FIG. 4D in accordance with the applied external magnetic field. As a result, the relative angle between the direction of magnetization of the magnetization free layer 307 and the direction of magnetization of the magnetization fixed layer (304a and 304b) of the lower magnetization fixed film, as well as the relative angle with the direction of magnetization of the magnetization fixed layer (309a and 309b) of the upper magnetization fixed film, changes as to change the electric resistance of the TMR device in accordance with the relative angle.

The change in electric resistance is sensed by the lower interconnection electrode layer 301 and the upper interconnection electrode layer 314 shown in FIG. 4D as a change in the sense current flowing in a direction perpendicular to the film plane (i.e., the vertical direction in FIG. 4D) of the TMR device. The lower interconnection electrode layer 301 is formed on the lower side of the antiferromagnetic layer 303 via a buffer layer 302 as shown in FIG. 4D, and the upper interconnection layer 314 is formed the on antiferromagnetic layer 311 via the protective layer 312.

In the present embodiment, an oxide of a ferromagnetic material of either of the neighboring magnetization fixed layers is used for the first and the second insulator material layers 305 and 310. It is possible to use a carbide or a nitride in the place of the oxide. The description for the oxide, carbide, or nitride is not given here because it is already referred in the first embodiment.

In case of using the TMR device as the memory cell of a magnetic memory device, the TMR device is formed on a semiconductor substrate as a part of the integrated circuit. In this case, the TMR device is formed on the lower interconnection electrode formed via a dielectric film disposed on the semiconductor substrate. The lower interconnection electrode is connected to a selection transistor formed on the principal plane of the semiconductor substrate via a plug interconnection penetrating the dielectric film.

Next, the fabrication process of the TMR device according to the third embodiment is described below.

First, a semiconductor substrate having formed thereon a semiconductor device such as a transistor or the like, to which the TMR device is to be connected, is prepared, and an interlayer dielectric film is formed on the surface thereof. After opening an aperture in the interlayer dielectric film in such a manner that it reaches the semiconductor substrate, a plug interconnection is formed buried in the aperture.

Then, by means of high vacuum sputtering, a first interconnection electrode layer 301 made of Al/W is formed as shown in FIG. 4A in such a manner that it may be connected to the plug interconnection. Furthermore, referring to FIG. 4A, a buffer layer 302 made of Ta, a first antiferromagnetic material layer 303 consisting essentially of IrMn, and a first magnetization fixed layer 304a about 2 nm in average thickness and made of $Co_9Fe$ are laminated sequentially on the first interconnection electrode layer 301.

The surface of the first magnetization fixed layer 304a is oxidized thereafter by exposing the surface to an oxygen atmosphere for a duration of 1 hour, and as shown in FIG. 4A, a first oxide material layer 305 about 0.5 nm in average thickness is formed on the surface of the first magnetization fixed layer 304a.

Then, referring to FIG. 4B, a second magnetization fixed layer 304b about 2 nm in average thickness and made of $CO_7Fe_3$, a first tunnel barrier layer 306 made of $Al_2O_3$, a magnetization free layer 307 made of $Co_9Fe$, a second tunnel barrier layer 308 made of $Al_2O_3$, and a third magnetization fixed layer 309a about 2.5 nm in average thickness and made of $Co_7Fe_3$ are laminated sequentially. The surface of the third magnetization fixed layer 309a is oxidized thereafter by exposing the surface to an oxygen atmosphere for a duration of 1 hour, and a second oxide material layer 310 about 0.5 nm in average thickness is formed on the surface of the third magnetization fixed layer 309a.

Then, referring to FIG. 4C, a fourth magnetization fixed layer 309b about 1.5 nm in average thickness and made of $Co_9Fe$, a second antiferromagnetic material layer 311 made of IrMn, and a protective layer 312 made of Ta are formed sequentially.

As described above, in the present embodiment, different materials are used in the neighboring magnetization fixed layers via the first and the second oxide material layers 305 and 310. In this manner, the coercive force of each of the upper and lower magnetization fixed layers is lowered. However, depending on the type of application, the same material may be used for the magnetization fixed layers disposed neighbored to each other via the first and second oxide material layers 305 and 310.

Then, a photoresist pattern (not shown) is formed to define the shape of the lower interconnection electrode on the protective layer 312, and by using this pattern as a mask, the portion of the region ranging from the protective layer 312 not covered by this mask to the lower electrode layer 301 is subjected to ion milling to form a pattern of the lower electrode layer 301 as shown in FIG. 4D.

Then, a photoresist pattern (not shown) is formed to define the shape of the tunnel junction, and by using this as a mask, the portion of the region ranging from the protective layer 312 to the first antiferromagnetic material layer 303 exposed out of the mask is removed by ion milling to form a pattern of the tunnel junction as shown in FIG. 4D.

Further, after removing the photoresist pattern, an interlayer dielectric film 313 is formed by depositing $SiO_2$ by reactive sputtering. Then, annealing is performed for about two hours at ca. 325° C. under vacuum while applying a magnetic field of about 7 kOe. In this manner, Mn diffuses from the first and the second antiferromagnetic material layers 303 and 311 to reach the first and the second insulator material layers 305 and 310, where the oxides of the ferromagnetic material constituting the magnetization fixed layer are reduced to incorporate Mn oxides into the first and the second insulator material layers 305 and 310. At the same time, the direction of magnetization in the first to the fourth magnetization fixed layers 304a, 304b, 309a, and 309b is fixed.

Further, after opening a contact hole in the interlayer dielectric film 313, an upper interconnection electrode 314 reaching the protective layer 312 is formed via the contact hole to obtain a complete dual spin valve TMR device constituting a MRAM.

Then, in the formation of the interlayer dielectric film and the interconnection electrodes necessary for the completion of a MRAM, a heat treatment is applied in the temperature range of ca. 300° C. or higher but not higher than ca. 400° C. In a SV-TMR device of a conventional type, only about 15% of magnetoresistivity ratio was available in the finished MRAM due to the heat treatment process. In contrast to above, the SV-TMR device according to the present embodiment showed excellent characteristics and yielded a magnetoresistivity ratio of about 40% on the completion of the MRAM. In addition, the effect above is also available even in case the oxide of the first and the second oxide material layers 305 and 310 is changed to a nitride or a carbide.

Fourth Embodiment of the Present Invention

Figure 5:
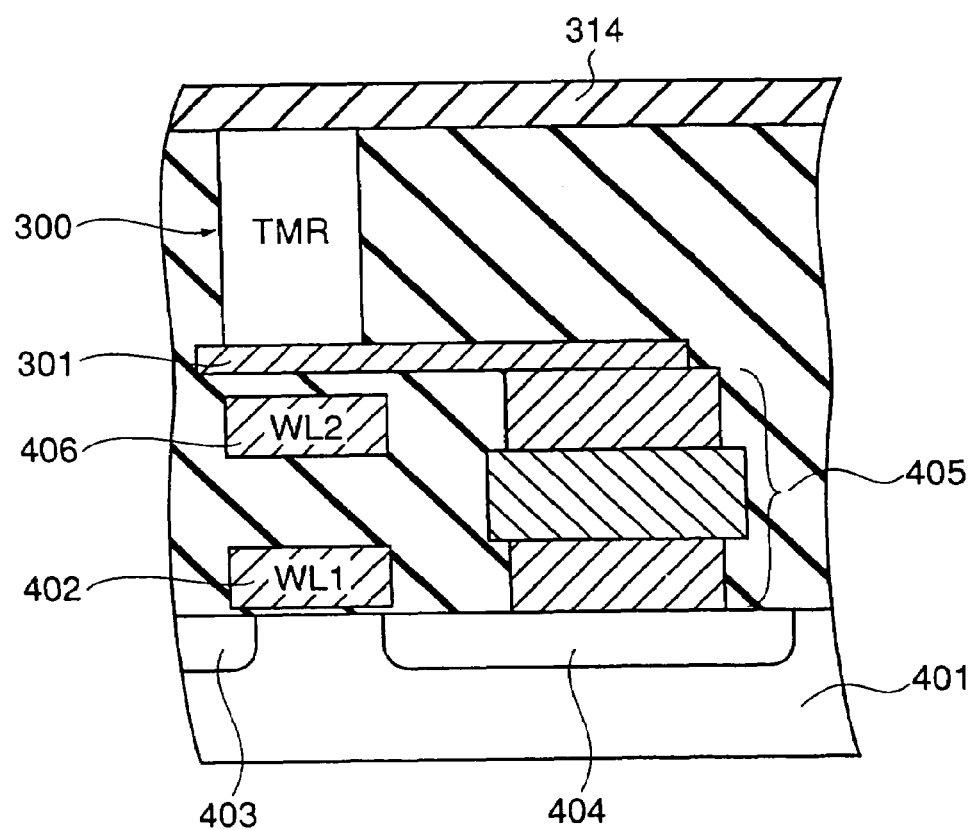
FIG. 5 is a cross section diagram provided as an explanatory means for a MRAM using a TMR device according to a fourth embodiment of the present invention.

FIG. 5 is a cross section view provided as explanatory means for describing a MRAM equipped with a TMR device according to a fourth embodiment of the present invention.

Referring to FIG. 5, a MOS transistor comprising a gate electrode 402 as well as source and drain regions 403 and 404, is formed on a silicon substrate 401. The gate electrode 402 constitutes a word line (WL1) for reading out, and a word line (WL2) for writing is formed above the gate electrode 402 via a dielectric film.

A plug interconnection 405 buried in the dielectric film is connected to the drain region 404 of the MOS transistor, and a lower interconnection electrode layer 301 is connected to the plug interconnection 405. A dual spin valve TMR device 300 as shown in FIG. 4B is formed above the upper portion of the word line (WL2) for writing, and on the lower interconnection electrode layer 301. An upper interconnection electrode 314, which provides a bit line (BL), is formed on the TMR device 300. As described in the third embodiment, a MRAM having such a structure exhibits superior characteristics. Further, the TMR devices described in the first, second, third, and fifth embodiments of the present invention are usable for the TMR device 300.

Fifth Embodiment of the Present Invention

An amorphous magnetic material layer can be used in the place of the insulator material layer 105, 205, 305, or 310 described in the first to the fourth embodiments of the present invention to suppress the grain boundary diffusion of Mn. This effect is believed attributed to the fact that the grain boundaries present in the magnetization fixed layer neighbored to the antiferromagnetic material layer are cut by the thin film made of an amorphous magnetic material.

Furthermore, it is believed that the magnetic coupling of the first and the second magnetization fixed layers neighboring to each other is less weakened so long as an amorphous magnetic material is used.

Moreover, unlike an insulator material, an amorphous magnetic material does not generate any tunnel resistance; hence, there is no fear of increasing the resistance of the device even if the average thickness is increased.

Any amorphous magnetic material known in the art may be used as the amorphous magnetic material above. As the amorphous magnetic material, usable are, for instance, $(CoFe)_{100-x}Y_x$ or $(CoFeNi)_{100-x}Y_x$, where, Y represents at least one element selected from the group consisting of B, Si, Zr, P, Mo, Al, and Nb.

Figure 6:
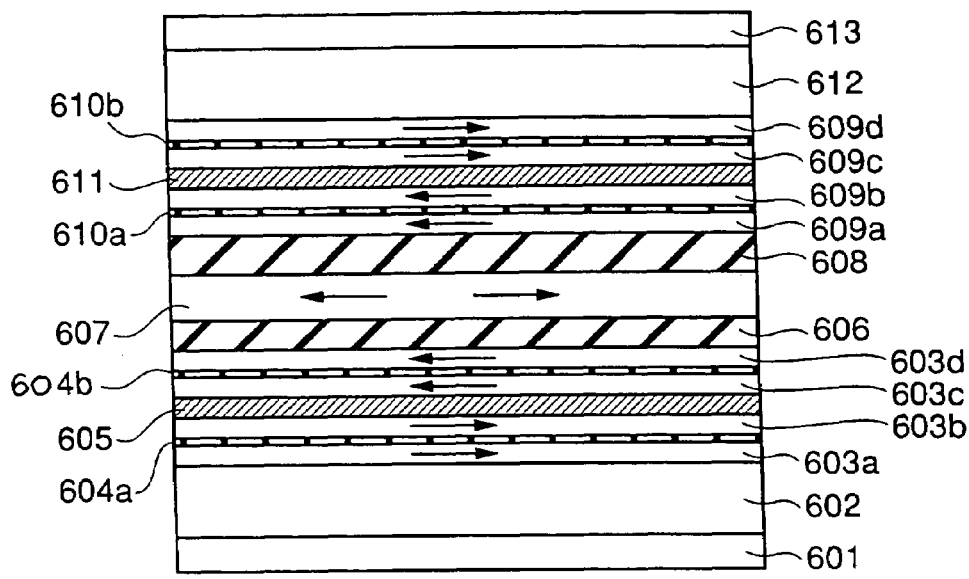
FIG. 6 is a cross section diagram showing a TMR device according to a fifth embodiment of the present invention.

FIG. 6 is a cross section view provided as an explanatory means for a TMR device according to a fifth embodiment of the present invention.

The TMR device according to the present embodiment is a dual spin valve TMR device having a dual tunnel junction comprising magnetization fixed films on the upper and the lower sides of a magnetization free layer via tunnel barrier layers.

The TMR device according to the present embodiment comprises a substrate (not shown) having provided sequentially thereon a buffer layer 601 made of NiCrPt, a first antiferromagnetic material layer 602 made of PtMn, a first magnetization fixed layer, a first tunnel barrier layer 606 made of $Al_2O_3$, a magnetization free layer 607 made of $Co_3Fe_3Ni_4$, a second tunnel barrier layer 608 made of $Al_2O_3$, a second magnetization fixed layer, a second antiferromagnetic material layer 612 made of PtMn, and a protective layer 613 made of Ta.

The first magnetization fixed layer comprises first to fourth magnetization fixed layers 603a, 603b, 603c, and 603d each made from a ferromagnetic material, a first amorphous magnetic layer 604a formed between the first and second magnetization fixed layers 603a and 603b, a second amorphous magnetic layer 604b formed between the third and fourth magnetization fixed layers 603c and 603d, and a first antiferromagnetically coupling layer 605 which antiferromagnetically couples the second and third magnetization fixed layers 603b and 603c.

The second magnetization fixed layer comprises a fifth to an eighth magnetization fixed layers 609a, 609b, 609c, and 609d each made from a ferromagnetic material, a third amorphous magnetic layer 610a formed between the fifth and sixth magnetization fixed layers 609a and 609b, a fourth amorphous magnetic layer 610b formed between the seventh and eighth magnetization fixed layers 609c and 609d, and a second antiferromagnetically coupling layer 611 which antiferromagnetically couples the sixth and seventh magnetization fixed layers 609b and 609c.

For the first to the eighth magnetization fixed layers 603a, 603b, 603c, 603d, 609a, 609b, 609c, and 609d, usable is $Co_6Fe_4$. Further, for the first to the fourth amorphous magnetic layers 610a, 610b, 610c, and 610d, there can be used $(Co_6Fe_4)_{0.95}B_{0.05}$. For the first and the second antiferromagnetically coupling layers 605 and 611, usable is Ru.

As described above, an antiferromagnetically coupling film comprising two antiferromagnetically coupling layers 603b and 603c antiferromagnetically coupled with each other via an antiferromagnetically coupling layer 605 can be used for the first magnetization fixed layer. Similarly, an antiferromagnetically coupling film comprising two antiferromagnetically coupling layers 609b and 609c antiferromagnetically coupled with each other via an antiferromagnetically coupling layer 611 can be used for the second magnetization fixed layer. By using these antiferromagnetically coupling films, magnetic field leak can be suppressed from occurring on the antiferromagnetically coupling film, and a fluctuation in characteristics attributed to the magnetic coupling between the magnetization fixed layer and the magnetization free layer can be prevented from occurring.

An antiferromagnetically coupling film using an antiferromagnetically coupling layer and two magnetization fixed layers is described in detail as a multifilm laminated pinned ferromagnetic layer in U.S. Pat. No. 5,465,185, and a part of its description is taken as a part of the description of the antiferromagnetically coupling film in the present specification. The discussion of U.S. Pat. No. 5,465,185 is incorporated herein by reference.

The TMR device according to the present embodiment provides a part of the integrated circuit formed on a semiconductor substrate, and the TMR device portion is fabricated on a lower interconnection electrode formed on the dielectric film.

The lower interconnection electrode is connected to the selection transistor formed on the principal plane of the substrate via a plug interconnection penetrating the interlayer dielectric film. The TMR device is fabricated by sequentially laminating the layers by means of high vacuum sputtering on a substrate having formed thereon the interlayer dielectric film and the plug.

The first to the fourth magnetization fixed layers 603a, 603b, 603c, and 603d are each provided at an average thickness of ca. 2 nm; the first to the fourth amorphous magnetic layers 604a, 604b, 610a, and 610b are each provided at an average thickness of ca. 1 nm; the first and the second antiferromagnetically coupling layers 605 and 611 are each provided at an average thickness of ca. 1.2 nm; the magnetization free layer is provided at an average thickness of ca. 2 nm; and the fifth to the eighth magnetization fixed layers 609a, 609b, 609c, and 609d are each provided at an average thickness of ca. 2 nm.

As explained in the first to fourth embodiments, the first and fourth amorphous magnetic layers 604a and 610b, which are near to the first and second antiferromagnetic material layers 602 and 612, respectively, control the diffusion of Mn diffused from the first and second antiferromagnetic material layers 602 and 612 into the first and second tunnel barrier layers 606 and 608.

The second amorphous magnetic layer 604b formed at a position farther than the first amorphous magnetic layer with respect to the position of the first antiferromagnetic material layer 602 adjusts the total amount of magnetization, such that the total magnetization of the first amorphous magnetic layer 604a and the first and the second magnetization fixed layers 603a and 603b might be equal to the total magnetization of the second amorphous magnetic layer 604b and the third and the fourth magnetization fixed layers 603c and 603d.

Similarly, the third amorphous magnetic layer 610a formed at a position farther than the fourth amorphous magnetic layer 610b with respect to the position of the second antiferromagnetic material layer 612 adjusts the total amount of magnetization, such that the total magnetization of the fourth amorphous magnetic layer 610b and the seventh and the eighth magnetization fixed layers 609c and 609d might be equal to the total magnetization of the third amorphous magnetic layer 610a and the fifth and the sixth magnetization fixed layers 609a and 609b.

On applying a heat treatment at a temperature of ca. 320° C. for a duration of about 10 hours to the spin valve TMR device having the laminated structure above, a favorable device characteristics was observed without causing any deterioration in characteristics.

The films and the layer constitution of the TMR device according to the present invention are not limited to the embodiments above, but various changes can be made thereto. For instance, magnetization fixed layers, magnetization free layers, ferromagnetic material layers, etc., each comprising a laminate structure consisting of a plurality of layers can be used.

The description of the materials used in each of the layers above is made for the as-deposited material. For instance, the layer material fabricated by depositing films by means of sputtering such as high vacuum sputtering as described above is described based on the target material used as the sputtering target. However, elements may be mixed within the neighboring layers. In general, such diffusion mixing incorporates impurities into the layers, and even though impurities should be present in the layers of a device, the device is still equivalent to the device defined by the claims so long as the constituent elements or materials correspond to the material defined by the claims.

As described in detail above, by interposing an insulator material layer or an amorphous magnetic material layer inside the magnetization fixed layer, the diffusion of Mn or other non-magnetic materials into the vicinity of the tunnel barrier layer can be suppressed, and a TMR device having excellent characteristics and thermal stability can be provided at a high production yield and yet at reduced cost.

The tunnel magnetoresistance effect device as disclosed in the present invention is applied to a magnetic memory device such as a MRAM, a magnetic reproduction head, or a magnetic reproduction device such as a HDD. The magnetic memory device is mounted on a portable personal device.

Figure 7:
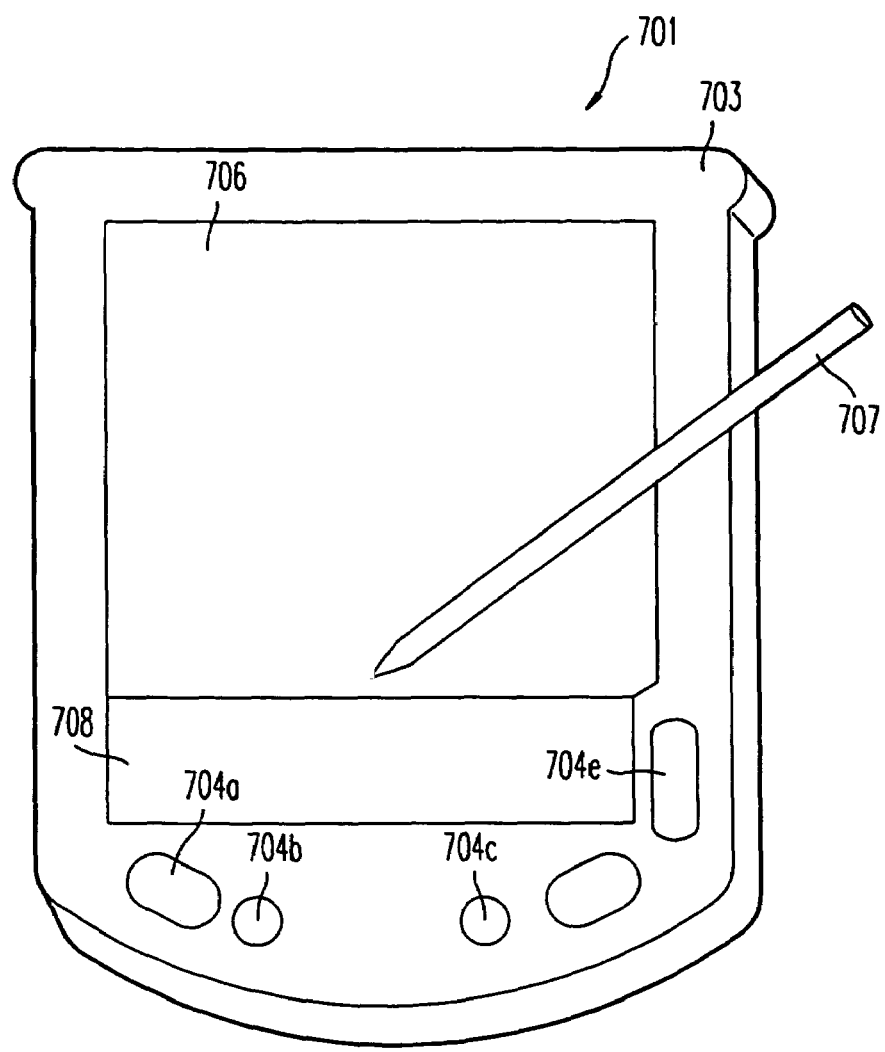
FIG. 7 is a bird's eye view of one embodiment of the portable personal device, which comprises a tunnel magnetoresistance effect device disclosed in one of the embodiments or those equivalents.

An example of the portable personal device is a personal digital assistant. FIG. 7 is a bird's eye view of one example of the personal digital assistant. The personal digital assistant 701 has a body 703 and some buttons 704a, 704b, 704c, 704d, and 704e are formed on a face of the body 703. Each of those buttons may an on/off switch, a time adjustment button, an escape button to cancel previous input or request, etc. A display 706 is formed on the face of the body 703 and may be formed on liquid crystal display. The input display 708 is formed below the display 706 and perceives characters written on its surface by a pencil 707. The personal digital assistant has a memory unit comprising the tunnel magnetoresistance effect device described in one of the embodiment or the equivalents thereof.

What is claimed is:

1. A tunnel magnetoresistance effect device, comprising:
   a first antiferromagnetic material layer containing manganese,
   a first magnetization fixed layer of ferromagnetic material disposed on the first antiferromagnetic material layer,
   a second magnetization fixed layer of ferromagnetic material,
   a first insulator layer between the first magnetization fixed layer and the second magnetization fixed layer,
   a first tunnel barrier layer of dielectric material disposed on the second magnetization fixed layer,
   a magnetization free layer of ferromagnetic material disposed on the first tunnel barrier layer, and
   an antiferromagnetically coupling layer and a third magnetization fixed layer disposed between the second magnetization fixed layer and the first tunnel barrier layer, the third magnetization fixed layer antiferromagnetically coupling to the second magnetization fixed layer through the antiferromagnetically coupling layer.

2. The tunnel magnetoresistance effect device of claim 1, wherein the first insulation layer contains manganese.

3. The tunnel magnetoresistance effect device of claim 1, wherein the first insulation layer has an average thickness not thinner than 0.2 nanometers and not thicker than 2 nanometers.

4. The tunnel magnetoresistance effect device of claim 1, wherein the first magnetization fixed layer of ferromagnetic material has a fixed magnetization of a first direction, and the second magnetization fixed layer of ferromagnetic material has a fixed magnetization of the first direction.

5. The tunnel magnetoresistance effect device of claim 1, further comprising:
   a second tunnel barrier layer of dielectric material on the magnetization free layer;
   a fourth magnetization fixed layer of ferromagnetic material on the second tunnel barrier layer;
   a fifth magnetization fixed layer of ferromagnetic material;
   a second insulator layer between the fourth magnetization fixed layer and the fifth magnetization fixed layer; and
   a second antiferromagnetic material layer containing manganese on the fifth magnetization fixed layer.

6. A tunnel magnetoresistance effect, device, comprising
   a first antiferromagnetic material layer containing manganese,
   a first magnetization fixed layer of a first ferromagnetic material on the first antiferromagnetic material layer,
   a first inserted layer on the first magnetization fixed layer and comprising $L_1X$, where $L_1$ is a ferromagnetic element of the first ferromagnetic material or a ferromagnetic element of a second ferromagnetic material, and X is an element selected from the group consisting of oxygen, nitrogen, and carbon,
   a second magnetization fixed layer of the second ferromagnetic material disposed on the first inserted layer,
   a first tunnel barrier layer of dielectric material on the second magnetization fixed layer, a magnetization free layer of ferromagnetic material disposed on the first tunnel barrier layer, and an antiferromagnetically coupling layer and a third magnetization fixed layer disposed between the second magnetization fixed layer and the first tunnel barrier layer, the third magnetization fixed layer antiferromagnetically coupling to the second magnetization fixed layer through the antiferromagnetically coupling layer.

7. The tunnel magnetoresistance effect device of claim 6, wherein the first inserted layer contains manganese.

8. The tunnel magnetoresistance effect device of claim 6, wherein the first inserted layer has an average thickness not thinner than 0.2 nanometers and not thicker than 2 nanometers.

9. The tunnel magnetoresistance effect device of claim 6, wherein the first magnetization fixed layer of ferromagnetic material has a fixed magnetization of a first direction, and the second magnetization fixed layer of ferromagnetic material has a fixed magnetization of the first direction.

10. The tunnel magnetoresistance effect device of claim 6, further comprising:
a second tunnel barrier layer of dielectric material on the magnetization free layer;
a fourth magnetization fixed layer of a third ferromagnetic material on the second tunnel barrier layer;
a second inserted layer disposed on the fourth magnetization fixed layer and comprising $L_2X$, where $L_2$ is a ferromagnetic element of the third ferromagnetic material or a ferromagnetic element of a fourth ferromagnetic material, and X is an element selected from the group consisting of oxygen, nitrogen, and carbon;
a fifth magnetization fixed layer of the fourth ferromagnetic material on the second inserted layer; and
a second antiferromagnetic material layer containing manganese on the fifth magnetization fixed layer.

11. A tunnel magnetoresistance effect device, comprising:
a first antiferromagnetic material layer containing manganese,
a first magnetization fixed layer of ferromagnetic material on the first antiferromagnetic material layer,
a first inserted layer of an amorphous magnetic material on the first magnetization fixed layer,
a second magnetization fixed layer of ferromagnetic material on the first inserted layer,
a first tunnel barrier layer of dielectric material on the second magnetization fixed layer,
a magnetization free layer of ferromagnetic material on the first tunnel barrier layer, and
an antiferromagnetically coupling layer and a third magnetization fixed layer disposed between the second maganetization fixed layer and the first tunnel barrier layer, the third magnetization fixed layer antiferromagnetically coupling to the second magnetization fixed layer through the antiferromagnetically coupling layer.

12. The tunnel magnetoresistance effect device of claim 11, wherein the amorphous magnetic material is $(CoFe)_{100-x}\ Y_x$ or $(CoFeNi)_{100-x}\ Y_x$, where Y is at least one element selected from the group consisting of B, Si, Zr, P, Mo, Al, and Nb.

13. The tunnel magnetoresistance effect device of claim 11, wherein the first magnetization fixed layer of ferromagnetic material has a fixed magnetization of a first direction, and the second magnetization fixed layer of ferromagnetic material has a fixed magnetization of the first direction.

14. The tunnel magnetoresistance effect device of claim 11, further comprising:
a second inserted layer of an amporphous magnetic material on the third magnetization fixed layer, and
a fourth magnetization fixed layer of ferromagnetic material between the second inserted layer and the first dielectric tunnel barrier layer.

15. The tunnel magnetoresistance effect device of claim 11, further comprising:
a second tunnel barrier layer of dielectric material on the magnetization free layer;
a fourth magnetization fixed layer of ferromagnetic material on the second tunnel barrier layer;
a second inserted layer of an amorphous magnetic material on the fourth magnetization fixed layer;
a fifth magnetization fixed layer of ferromagnetic material on the second inserted layer, and
a second antiferromagnetic material layer containing manganese on the fifth magnetization fixed layer.

16. The tunnel magnetoresistance effect device of claim 11, wherein the first inserted layer contains manganese.

17. The tunnel magnetoresistance effect device of claim 11, further comprising:
an upper interconnection electrode and a lower electrode provided to sense a change in electrical resistance due to a magnetization state of the magnetization free layer; and
an interlayer dielectric film disposed on a side of at least the first, second, and third magnetization fixed layers.

18. The tunnel magnetoresistance effect device of claim 11,
wherein the first inserted layer suppresses diffusion of material from the first antiferromagnetic material layer into the first tunnel barrier layer.

19. The tunnel magnetoresistance effect device of claim 11,
wherein the first inserted layer suppresses diffusion of manganese from the first antiferromagnetic material layer into the first tunnel barrier layer.

20. A tunnel magnetoresistance effect device, comprising:
a first antiferromagnetic material layer containing manganese;
a first magnetization fixed layer of ferromagnetic material on the first antiferromagnetic material layer;
a first inserted layer on the first magnetization fixed layer and comprising MX, where M is an element selected from the group consisting of manganese, titanium, tantalum, vanadium, aluminum, europium, and scandium, and X is an element selected from the group consisting of oxygen, nitrogen, and carbon;
a second magnetization fixed layer of ferromagnetic material on the first inserted layer;
a first tunnel barrier of dielectric material on the second magnetization fixed layer;
a magnetization free layer of ferromagnetic material on the first tunnel barrier layer;
a second tunnel barrier layer of dielectric material on the magnetization free layer;
a third magnetization fixed layer of ferromagnetic material on the second tunnel barrier layer;
a second inserted layer on the third magnetization fixed layer, the second inserted layer comprising MX, where M is an element selected from the group consisting of titanium, tantalum, vanadium, aluminum, europium, and scandium, and X is an element selected from the group consisting of oxygen, nitrogen, and carbon;

a fourth magnetization fixed layer of ferromagnetic material on the second inserted layer, a second antiferromagnetic material layer containing manganese on the fourth magnetization fixed layer, and an antiferromagnetically coupling layer and a fifth magnetization fixed layer disposed between the second magnetization fixed layer and the first tunnel barrier layer, the fifth magnetization fixed layer antiferromagnetically coupling to the second magnetization fixed layer through the antiferromagnetically coupling layer.

21. A tunnel magnetoresistance effect device, comprising:
a first antiferromagnetic material layer containing manganese;
a first magnetization fixed layer of ferromagnetic material on the first antiferromagnetic material layer;
a first inserted layer on the first magnetization fixed layer and comprising NX, where N is first element, X is a second element selected from the group consisting of oxygen, nitrogen, and carbon, and the bonding energy between the first and second elements is higher than the bonding energy between manganese and the second element;
a second magnetization fixed layer of ferromagnetic material on the first inserted layer;
a first tunnel barrier layer of dielectric material on the second magnetization fixed layer;
a magnetization free layer of ferromagnetic material on the first tunnel barrier layer;
a second tunnel barrier layer of dielectric material on the magnetization free layer;
a third magnetization fixed layer of ferromagnetic material on the second tunnel barrier layer;
a second inserted layer on the third magnetization fixed layer, and the second inserted layer comprising NX, where N is a first element, X is a second element selected from the group consisting of oxygen, nitrogen, and carbon, and the bonding energy between the first and second elements is higher than the bonding energy between manganese and the second element;
a fourth magnetization fixed layer of ferromagnetic material on the second inserted layer,
a second antiferromagnetic material layer including manganese on the fourth magnetization fixed layer, and
an antiferromagnetically coupling layer and a fifth magnetization fixed layer disposed between the second magnetization fixed layer and the first tunnel barrier layer, the fifth magnetization fixed layer antiferromagnetically coupling to the second magnetization fixed layer through the antiferromagnetically coupling layer.

22. A portable personal device, comprising:
a memory device including a tunnel magnetoresistance effect device, comprising,
a first antiferromagnetic material layer containing manganese,
a first magnetization fixed layer of ferromagnetic material on the first antiferromagnetic material layer,
a second magnetization fixed layer of ferromagnetic material,
a first insulator layer between the first magnetization fixed layer, and the second magnetization fixed layer,
a first tunnel barrier layer of dielectric material on the second magnetization fixed layer,
a magnetization free layer of ferromagnetic material on the first tunnel barrier layer, and
an antiferromagnetically coupling layer and a third magnetization fixed layer disposed between the second magnetization fixed layer and the first tunnel barrier layer, the third magnetization fixed layer antiferromagnetically coupling to the second magnetization fixed layer through the antiferromagnetically coupling layer.

23. A portable personal device, comprising:
a memory device including a tunnel magnetoresistance effect device, comprising,
a first antiferromagnetic material layer containing manganese,
a first magnetization fixed layer of ferromagnetic material on the first antiferromagnetic material layer,
a first inserted layer on the first magnetization fixed layer and comprising MX, where M is an element selected from the group consisting of manganese, titanium, tantalum, vanadium, aluminum, europium, and scandium, and X is an element selected from the group consisting of oxygen, nitrogen, and carbon,
a second magnetization fixed layer of ferromagnetic material on the first inserted layer,
a first tunnel barrier of dielectric material on the second magnetization fixed layer,
a magnetization free layer of ferromagnetic material on the first tunnel barrier layer, and
an antiferromagnetically coupling layer and a third magnetization fixed layer disposed between the second magnetization fixed layer and the first tunnel barrier layer the third magnetization fixed layer antiferromagnetically coupling to the second magnetization fixed layer through the antiferromagnetically coupling layer.

24. A portable personal device, comprising:
a memory device including a tunnel magnetoresistance effect device, comprising,
a first antiferromagnetic material layer containing manganese,
a first magnetization fixed layer of ferromagnetic material on the first antiferromagnetic material layer,
a first inserted layer on the first magnetization fixed layer and comprising NX, where N is first element, X is a second element selected from the group consisting of oxygen, nitrogen, and carbon, and the bonding energy between the first and second elements is higher than the bonding energy between manganese and the second element,
a second magnetization fixed layer of ferromagnetic material on the first inserted layer,
a first tunnel barrier layer of dielectric material on the second magnetization fixed layer,
a magnetization free layer of ferromagnetic material on the first tunnel barrier layer, and
an antiferromagnetically coupling layer and a third magnetization fixed layer disposed between the second magnetization fixed layer and the first tunnel barrier layer, the third magnetization fixed layer antiferromagnetically coupling to the second magnetization fixed layer through the antiferromagnetically coupling layer.

25. A portable personal device, comprising:
a memory device including a tunnel magnetoresistance effect device, comprising,
a first antiferromagnetic material layer containing manganese,
a first magnetization fixed layer of a first ferromagnetic material on the first antiferromagnetic material layer,
a first inserted layer on the first magnetization fixed layer and comprising $L_1X$, where $L_1$ is a ferromagnetic element of the first ferromagnetic material or a ferromagnetic element of a second ferromagnetic material, and X is an element selected from the group consisting of oxygen, nitrogen, and carbon, a second magnetization fixed layer of the second ferromagnetic material on the first inserted layer, a first tunnel barrier layer of ferromagnetic material on the second magnetization fixed layer, a magnetization free layer of ferromagnetic material on the first tunnel barrier layer, and an antiferromagnetically coupling layer and a third magnetization fixed layer disposed between the second magnetization fixed layer and the first tunnel barrier layer, the third magnetization fixed layer antiferromagnetically coupling to the second magnetization fixed layer through the antiferromagnetically coupling layer.

26. A portable personal device, comprising:

a memory device including a tunnel magnetoresistance effect device, comprising, a first antiferromagnetic material layer containing manganese, a first magnetization fixed layer of ferromagnetic material on the first antiferromagnetic material layer, a first inserted layer of an amorphous magnetic material on the first magnetization fixed layer, a second magnetization fixed layer of ferromagnetic material on the first inserted layer, a first tunnel barrier layer of dielectric material on the second magnetization fixed layer, a magnetization free layer of ferromagnetic material on the first tunnel barrier layer; and an antiferromagnetically coupling layer and a third magnetization fixed layer disposed between the second maganetization fixed layer and the first tunnel barrier layer, the third magnetization fixed layer antiferromagnetically coupling to the second magnetization fixed layer through the antiferromagnetically coupling layer.

27. A memory device utilizing a tunnel magnetoresistance effect, comprising:

a first antiferromagnetic material layer containing manganese, a first magnetization fixed layer of ferromagnetic material on the first antiferromagnetic material layer, a first inserted layer of an amorphous magnetic material on the first magnetization fixed layer, a second magnetization fixed layer of ferromagnetic material on the first inserted layer, a first tunnel barrier layer of dielectric material on the second magnetization fixed layer, a magnetization free layer of ferromagnetic material on the first tunnel barrier layer, and an antiferromagnetically coupling layer and a third magnetization fixed layer disposed between the second maganetization fixed layer and the first tunnel barrier layer, the third magnetization fixed layer antiferromagnetically coupling to the second magnetization fixed layer through the antiferromagnetically coupling layer.

* * * * *